(12) United States Patent
Furge

(10) Patent No.: US 8,036,402 B2
(45) Date of Patent: Oct. 11, 2011

(54) DISTORTION COMPENSATION

(75) Inventor: Kenneth Carl Furge, Howell, MI (US)

(73) Assignee: Harman International Industries, Incorporated, Northridge, CA (US)

( * ) Notice: Subject to any disclaimer, the term of this patent is extended or adjusted under 35 U.S.C. 154(b) by 1602 days.

(21) Appl. No.: 11/305,498

(22) Filed: Dec. 15, 2005

(65) Prior Publication Data

US 2007/0140513 A1    Jun. 21, 2007

(51) Int. Cl.
*H03F 99/00* (2009.01)
(52) U.S. Cl. .......... 381/120; 381/86; 381/104; 381/106; 330/135; 330/305
(58) Field of Classification Search .......... 381/104–109, 381/120, 55, 58–59, 86, 302, 94.8; 330/135, 330/305
See application file for complete search history.

(56) References Cited

U.S. PATENT DOCUMENTS

| | | |
|---|---|---|
| 3,944,944 A | 3/1976 | Ellenbecker |
| 3,952,256 A | 4/1976 | Kosinski et al. |
| 3,983,337 A | 9/1976 | Babb |
| 4,025,871 A | 5/1977 | Peil |
| 4,096,443 A | 6/1978 | Gilson |
| 4,130,725 A | 12/1978 | Nagel |
| 4,147,985 A | 4/1979 | Rogers |
| 4,163,197 A | 7/1979 | Sampei |
| 4,163,198 A | 7/1979 | Berning |
| 4,180,707 A | 12/1979 | Moog |
| 4,232,190 A | 11/1980 | Laiacona |
| 4,233,566 A | 11/1980 | Nestorovic |
| 4,239,937 A | 12/1980 | Kampmann |
| 4,243,946 A | 1/1981 | Wang |
| 4,270,151 A | 5/1981 | Steinmaier |
| 4,276,623 A | 6/1981 | Abbott |
| 4,296,278 A | 10/1981 | Cullison et al. |
| 4,311,872 A | 1/1982 | Davis |
| 4,312,060 A | 1/1982 | Grodinsky |
| 4,313,360 A | 2/1982 | Faulkner |
| 4,319,359 A | 3/1982 | Wolf |
| 4,321,581 A | 3/1982 | Tappeiner et al. |
| 4,345,215 A | 8/1982 | Amada et al. |
| 4,384,505 A | 5/1983 | Cotton, Jr. et al. |

(Continued)

FOREIGN PATENT DOCUMENTS

WO    WO 00/65872 A    11/2000

(Continued)

OTHER PUBLICATIONS

European Search Report dated Apr. 3, 2008, European Application No. 06025257.4, 8 pgs.

*Primary Examiner* — Devona Faulk
*Assistant Examiner* — Disler Paul
(74) *Attorney, Agent, or Firm* — Brinks Hofer Gilson & Lione

(57) ABSTRACT

A distortion compensation system minimizes distortion in an audio system by monitoring a supply voltage and adjusting a clipping threshold and/or compression knee. An adjustable gain circuit controls the gain of the audio signal according whether the audio signal exceeds a variable threshold. The variable threshold is adjusted within a threshold range based on the supply voltage. Distortion due to clipping of the audio signal is minimized while available power at any given time is maximized.

22 Claims, 4 Drawing Sheets

U.S. PATENT DOCUMENTS

| | | | |
|---|---|---|---|
| 4,422,050 A | 12/1983 | Suzuki | |
| 4,484,150 A | 11/1984 | Carver | |
| 4,495,382 A | 1/1985 | Smith et al. | |
| 4,495,640 A | 1/1985 | Frey | |
| 4,500,850 A | 2/1985 | Grodinsky | |
| 4,520,322 A | 5/1985 | Ishii | |
| 4,524,335 A | 6/1985 | Yokoyama | |
| 4,549,146 A | 10/1985 | Cowans et al. | |
| 4,567,443 A | 1/1986 | Zwicky | |
| 4,584,700 A | 4/1986 | Scholz | |
| 4,594,561 A | 6/1986 | Grodinsky et al. | |
| 4,600,891 A | 7/1986 | Taylor, Jr. et al. | |
| 4,622,660 A | 11/1986 | Cowans et al. | |
| 4,627,094 A | 12/1986 | Scholz | |
| 4,672,671 A | 6/1987 | Kennedy | |
| 4,683,589 A | 7/1987 | Scholz et al. | |
| 4,688,002 A | 8/1987 | Wingate | |
| 4,724,406 A | 2/1988 | Lewis | |
| 4,792,751 A | 12/1988 | Blumenkranz et al. | |
| 4,797,633 A | 1/1989 | Humphrey | |
| 4,847,888 A | 7/1989 | Cox et al. | |
| 4,855,093 A | 8/1989 | Yoshida | |
| 4,864,624 A | 9/1989 | Tichy | |
| 4,881,047 A | 11/1989 | Waller, Jr. | |
| 4,890,331 A | 12/1989 | Brown, Sr. et al. | |
| 4,910,441 A | 3/1990 | Wetta | |
| 4,912,424 A | 3/1990 | Nicola et al. | |
| 4,928,071 A | 5/1990 | Yamamoto et al. | |
| RE33,333 E | 9/1990 | Taylor, Jr. et al. | |
| 5,001,440 A | 3/1991 | Zerod | |
| 5,014,347 A | 5/1991 | Cox et al. | |
| 5,022,078 A | 6/1991 | Zelenz | |
| 5,023,915 A | 6/1991 | Brown, Sr. et al. | |
| 5,032,796 A | 7/1991 | Tiers et al. | |
| 5,057,790 A | 10/1991 | Landi | |
| 5,096,633 A | 3/1992 | Yoshida | |
| 5,097,224 A | 3/1992 | Madaffari et al. | |
| 5,107,389 A | 4/1992 | Botti et al. | |
| 5,109,542 A | 4/1992 | Ecklund | |
| 5,129,006 A | 7/1992 | Hill et al. | |
| 5,132,637 A | 7/1992 | Swanson | |
| 5,200,711 A | 4/1993 | Andersson et al. | |
| 5,206,914 A | 4/1993 | Fortney et al. | |
| 5,216,376 A | 6/1993 | Swanson | |
| 5,239,699 A | 8/1993 | Ecklund | |
| 5,255,324 A | 10/1993 | Brewer et al. | |
| 5,263,087 A | 11/1993 | Fosgate | |
| 5,263,185 A | 11/1993 | Bush | |
| 5,280,528 A | 1/1994 | Fosgate | |
| 5,302,912 A | 4/1994 | Grant | |
| 5,339,363 A | 8/1994 | Fosgate | |
| 5,343,159 A | 8/1994 | Butler | |
| RE34,720 E | 9/1994 | Zelenz | |
| 5,376,896 A | 12/1994 | Graefe et al. | |
| 5,422,804 A | 6/1995 | Clark | |
| 5,430,409 A | 7/1995 | Buck et al. | |
| 5,442,316 A | 8/1995 | Buck et al. | |
| 5,442,352 A | 8/1995 | Jackson | |
| 5,453,716 A | 9/1995 | Person et al. | |
| 5,548,650 A | 8/1996 | Clark | |
| 5,557,239 A | 9/1996 | Masao | |
| 5,596,646 A | 1/1997 | Walker, Jr. et al. | |
| 5,644,263 A | 7/1997 | Clark | |
| 5,672,998 A | 9/1997 | Wittlinger | |
| 5,677,960 A | 10/1997 | Unno et al. | |
| 5,686,957 A | 11/1997 | Baker | |
| 5,731,736 A | 3/1998 | Ezell | |
| 5,740,255 A | 4/1998 | Salz | |
| 5,768,399 A | 6/1998 | Statham et al. | |
| 5,789,689 A | 8/1998 | Doidic et al. | |
| 5,815,040 A | 9/1998 | Barbetta | |
| 5,838,269 A | 11/1998 | Xie | |
| 5,892,473 A | 4/1999 | Shin | |
| 5,894,522 A | 4/1999 | Brown | |
| 5,936,470 A | 8/1999 | Stroud | |
| 5,942,885 A | 8/1999 | Nemoto et al. | |
| 5,978,488 A | 11/1999 | Margolin | |
| 6,061,455 A | 5/2000 | Hadley et al. | |
| 6,084,450 A | 7/2000 | Smith et al. | |
| 6,140,870 A | 10/2000 | Cook | |
| 6,144,256 A | 11/2000 | Barbetta | |
| 6,163,212 A | 12/2000 | Konno | |
| 6,173,056 B1 * | 1/2001 | Romesburg et al. | 379/406.01 |
| 6,201,873 B1 | 3/2001 | Dal Farra | |
| 6,268,770 B1 | 7/2001 | Barbetta | |
| 6,297,692 B1 | 10/2001 | Nielsen | |
| 6,310,959 B1 | 10/2001 | Alexander | |
| 6,320,278 B1 | 11/2001 | Nishiyama et al. | |
| 6,320,460 B1 | 11/2001 | Meszlenyi | |
| 6,373,336 B1 | 4/2002 | Anderskouv et al. | |
| 6,388,524 B1 | 5/2002 | Anderson, Jr. et al. | |
| 6,400,933 B1 | 6/2002 | Mensink et al. | |
| 6,414,549 B1 | 7/2002 | Barbetta | |
| 6,452,366 B1 | 9/2002 | Hwang | |
| 6,476,745 B1 | 11/2002 | Evans et al. | |
| 6,483,281 B2 | 11/2002 | Hwang | |
| 6,535,612 B1 | 3/2003 | Croft, III et al. | |
| 6,541,944 B2 | 4/2003 | Hwang | |
| 6,556,685 B1 * | 4/2003 | Urry et al. | 381/94.1 |
| 6,904,156 B1 * | 6/2005 | LeReverend | 381/312 |
| 6,970,571 B2 * | 11/2005 | Knorr et al. | 381/370 |
| 2002/0090096 A1 * | 7/2002 | Blind et al. | 381/104 |
| 2003/0044028 A1 | 3/2003 | Cranfill et al. | |
| 2003/0050661 A1 | 3/2003 | Kramer | |
| 2003/0078009 A1 | 4/2003 | Gierl et al. | |
| 2004/0005065 A1 * | 1/2004 | Griesinger | 381/17 |
| 2005/0047615 A1 | 3/2005 | Kawamura et al. | |
| 2005/0100179 A1 | 5/2005 | Behboodian et al. | |

FOREIGN PATENT DOCUMENTS

WO    WO 2004/023631 A    3/2004

* cited by examiner

DISTORTION COMPENSATION

BACKGROUND OF THE INVENTION

1. Technical Field

The invention relates to audio amplifiers, and particularly to distortion compensation in amplifiers for vehicle audio systems.

2. Related Art

Automotive audio systems include one or more amplifiers that provide gain for audio signals. The gain of an amplifier depends, at least in part, on the amount of power supplied to the amplifier. Because the supply voltage varies over a range of several volts, the amount of power that is available to the amplifier will also vary over a wide range. If the voltage in the vehicle is insufficient for the amplifier to accurately amplify the input signal, the amplifier may clip, and the audio signal from the amplifier will be distorted. Accordingly, amplifiers may be designed to control audio output according to fluctuations, or variations, in the limits of the battery supply voltage, or minimum expected available power.

To preclude the amplifier from being overdriven, an amplifier may control the audio output based on analog or digital signal processing techniques. For example, an amplifier may monitor the audio signal to modify portions of the audio output signal that may exceed a predetermined threshold. Analog amplifiers may use an analog clip detection circuit, which utilizes a voltage controlled amplifier to reduce overall gain during portions of the audio output signal that exceeds the vehicle voltage. Since clip detection of monolithic power amplifier integrated circuits is typically shared over two or more channels, the analog control maintains a relatively constant amount of distortion, but may not control the distortion for each channel independently.

A digital amplifier may use a digital signal processor (DSP) to predict an output signal level on the channels of a digitally-sampled audio signal. The DSP reduces the gain for the portions of the signal that exceed a programmed threshold. A DSP may independently control each channel to tailor the amount of distortion. However, the threshold may be set, or hard-coded, into the digital signal processor. To account for variations in power supplied to the amplifier, the threshold may be set much lower than the actual level that may be available from the battery. Accordingly, hard-coded distortion limiting using a DSP may not provide an optimal amplification of the audio signal for a wide range of battery supply voltages.

Therefore, there is a need for a distortion compensation for automotive amplifier applications.

SUMMARY

A system controls or compensates for audio distortion based on a supply voltage, such as the voltage supplied by the battery of an automobile. A signal related to the supply voltage is used to control the gain, and distortion, of an audio signal. In an example, the supply voltage signal is used to control a threshold level that determines whether the audio signal may be clipped. Using the supply voltage provides for control of distortion, increasing the perceived sound quality.

A clipping threshold may be adjusted according to a supply voltage signal. An audio amplifier may be tuned to have a pre-determined clipping threshold, or tuned threshold based on the supply voltage at the time of tuning. A signal associated with the supply voltage can be used to determine an adjustment to the tuned threshold to provide an applied threshold. As the battery voltage decreases, the signal associated with the decreased battery voltage decreases the tuning threshold by an appropriate amount to decrease the applied threshold. When the battery voltage increases, the tuned threshold may be increased accordingly to maximize the amplifier operation. Accordingly, the threshold may be modified according to the supply voltage to maintain a fixed level of distortion and maximize power output.

An exemplary automotive audio amplifier includes a gain circuit, a threshold detect circuit, and a voltage sensor. The gain circuit controls the gain for at least one channel of a multi-channel audio signal. The gain is controlled based on a gain adjust signal. The threshold detect circuit generate the gain adjust signal based on whether an output of the gain circuit exceeds the threshold. The voltage sensor generates a voltage sense signal associated with a battery supply voltage for the amplifier. The threshold is adjustable according to the voltage sense signal.

Another exemplary automotive audio system includes a controller and an amplifier. The controller provides control of the gain for each channel of a multi-channel audio signal based on whether the audio signal exceeds a threshold. The threshold is adjustable according to the supply voltage of the audio system. The amplifier amplifies the gain adjusted multi-channel audio signal.

Another exemplary automotive audio system includes a compressor circuit and a voltage sensor. The compressor controls a signal level for at least one channel of a multi-channel audio signal. A compression ratio transition point, or knee, of the compressor is controlled according to a voltage sense signal generated by the sensor.

An exemplary method includes detecting whether an amplified audio signal will exceed a threshold limit. When the amplified signal exceeds the threshold limit, the gain of an amplifier circuit corresponding to the channel is reduced. A rail voltage is detected and may be used to modify the threshold limit.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

A distortion compensation system minimizes audio distortion by monitoring a supply voltage. In the figures, components, features and integral parts that correspond to one another each have the same reference number. The figures are not true to scale.

The distortion compensation system may by used with an automotive or vehicle audio system. A distortion compensation system may be a component or a unitary part of an audio amplifier for the automotive audio system. The audio amplifier is powered by a rail voltage supplied by the automotive battery. The rail voltage may fluctuate within an operating range typically from around 9 Volts to around 14 Volts. The rail voltage is compared or measured against a reference voltage, which may be a tuning voltage. A signal representative of the comparison, or measurement, is generated. The signal is sent to a controller that processes the multi-channel audio signal for the audio system. The controller controls gain of an audio signal based on a comparison of the rail voltage to the tuning voltage. The gain is controlled according to whether the audio signal exceeds a variable threshold. The threshold is varied within a threshold range according to the comparison. Accordingly, distortion in the audio signal may be compensated according to supply voltage.

In a method that compensates for distortion, the gain of an audio signal is controlled through a comparison of a rail voltage to a tuning voltage. Based on the comparison, a cutoff threshold for an amplifier and/or the knee of a compressor is adjusted to minimize distortion in the audio path.

Figure 1:
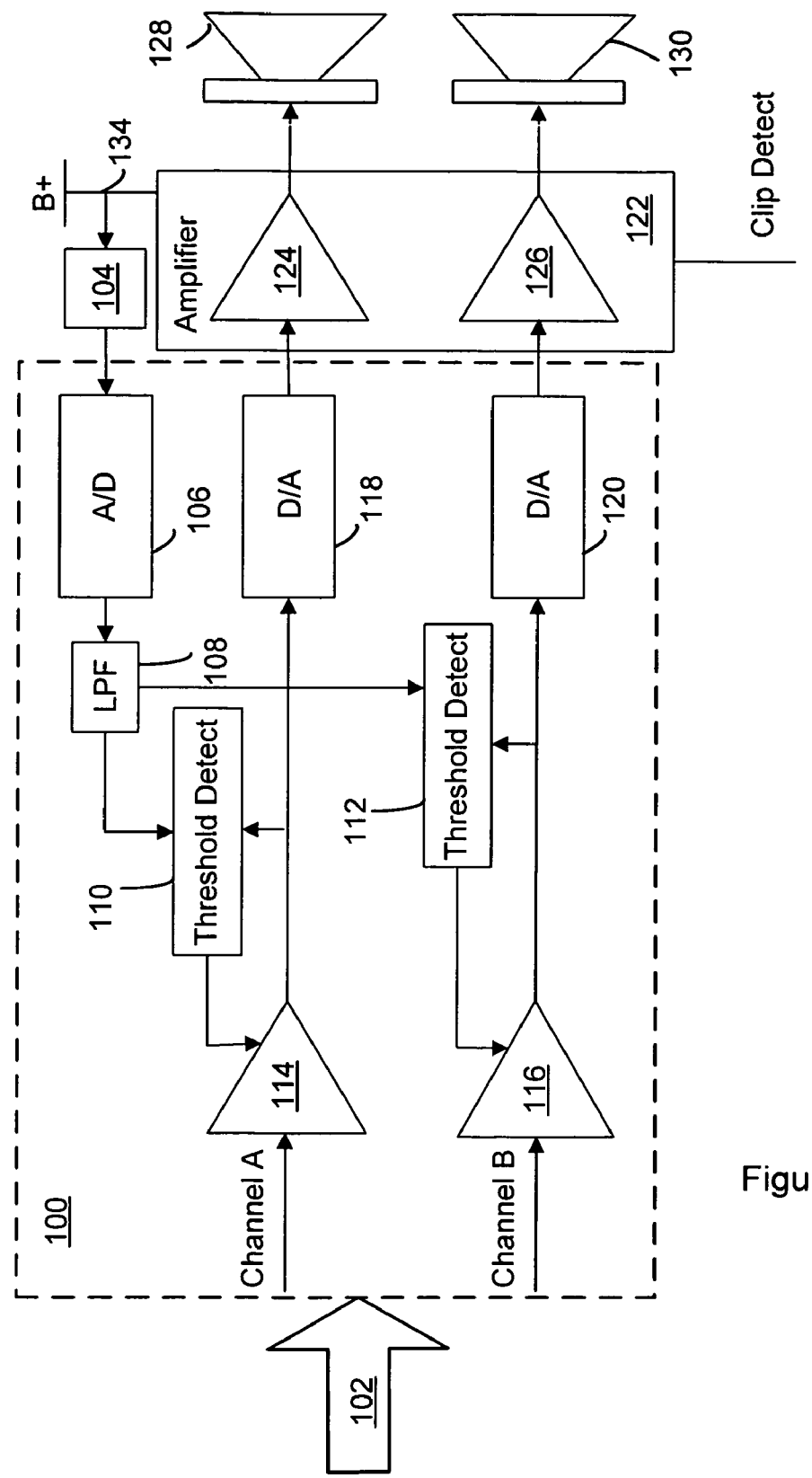
FIG. 1 is a block diagram of an exemplary distortion compensation system.

FIG. 1 is a block diagram of an exemplary distortion compensation system 100. The distortion compensation system 100 may be configured as a controller, or may be a unitary part of a controller that processes an audio signal. The controller may be a programmable microprocessor, a digital signal processor, or combination programmable microprocessor and digital signal processor. The controller may also include other analog and digital components and circuits such as analog-to-digital converters (ADC), digital to analog converters (DAC), digital and/or analog filters, memory, buffers and the like.

The distortion compensation system 100 provides a portion of a path for an audio signal 102 to an amplifier 122 and to one or more speakers or drivers 128 and 130. The audio path may include various electrical and/or electronic components configured to process an audio signal, including switches, controllers, amplifiers, gates, suppressors, comparators, transistors, resistors, inductors, capacitors, diodes, clamps, buffers, memory and the like. The components may be physical devices configured to provide a discrete processing function, devices configured to execute code configured to carry out discrete and/or complex functions, computations, and calculations, or combinations thereof.

The audio signal 102 is a multi-channel digital signal. Each channel of the audio signal 102 may be a discrete-time signal whose values belong to a finite set, where at a point in time t, the signal has one of a finite number of discrete values. The signal may be a continuous stream or multi-bit binary signal whose vales may be represented by a "1" or a "0." In an exemplary embodiment, each channel is a 24-bit digital signal. Although FIG. 1 illustrates a multi-channel audio signal 102 having two channels (Channel A and Channel B), the audio signal 102 may also have one or more channels. The multi-channel audio signal 102 also may include a channel for one of several speakers or drivers 128 and 130 and/or may include a channel that is split or shared among speakers or drivers 128 and 130. The channels may be paired or linked. For example, the audio signal may include signals to provide a stereophonic sound stage and/or a surround sound stage. The channels may be paired based on a location of a sound stage in which the signal is replicated. For example, front channels of a multi-channel signal 102 may be paired, rear channels may be paired, surround channels may be paired. The pairing or linking of the channels may allow for a balance signal processing according to the pairing or linking to maintain the dynamics of the sound stage of the multi-channel signal.

The distortion compensation system 100 controls gain and/or compression for the channels of the audio signal 102. The gain-controlled signal from the distortion compensation system 100 is provided to the amplifier 122, which increases the voltage of the audio signal 102. The amplifier 122 includes amplifier circuits 124 and 126 associated with each channel (Channel A and Channel B) of the audio signal 102. Each channel of the amplified audio signal 102 is sent to one or more corresponding loudspeakers or drivers 128 and 130. The loudspeakers 128 and 130 generate sound waves based on the received signal by converting the signals to audible sound.

The distortion compensation system 100 includes a processing path corresponding to each channel of the audio signal 102. Each audio path includes a limiter 114 and 116, a threshold detector 110 and 112, and a digital-to-analog converter (DAC) 118 and 120. Each channel of the audio is received at a corresponding limiter 114 and 116.

In some distortion compensation systems 100, the limiters 114 and 116 are configured as variable gain amplifiers that provide or control an amount of gain for the corresponding channel of the audio signal provided at its input. The amount of gain is controlled by a signal received from the corresponding threshold detector 110 and 112. The variable gain amplifiers 114 and 116 are controlled to reduce the amount of gain provided to the audio signal when the corresponding threshold detector 110 and 112 detects that the audio signal at the output of the corresponding variable gain amplifier exceeds a threshold. The variable gain amplifiers 114 and 116 are also controlled to increase the gain for the audio signal toward a unity gain when the corresponding threshold detector 110 and 112 detects that the audio signal at the output of the corresponding variable gain amplifier 114 and 116 does not exceed a threshold. Although FIG. 1 shows separate threshold detectors 110 and 112 for each processing path for illustrative purposes, the distortion compensation system 100 may have multiple threshold detectors 110 and 112 where each path includes at least one threshold detector, or may have a single threshold detector for all processing paths.

The distortion compensation system 100 also includes a processing path for a rail voltage signal 134. The rail voltage signal 134 may be associated with the power supply B+ for the audio system and/or components of an audio system such as amplifier 122. For example, in some automotive audio systems, the rail voltage B+ is the battery supply voltage for the vehicle.

The rail voltage signal 134 may be processed by the distortion compensation system 100 through a conditioning circuit 104. The conditioning circuit 104 may include electrical and electronic components configured to provide a conditioned signal to the distortion compensation system 100. The conditioning circuit may include switches, comparators, bridges, dividers, clamps, suppressors, combinations thereof and the like. The conditioning circuit 104 may include a voltage divider that reduces the rail voltage B+ to a range which may be processed by a controller. The conditioning circuit 104 may also include a diode circuit configured to clamp voltage spikes and other voltages that are outside an operating or input range for a controller.

The rail voltage signal 134 is provided to the distortion compensation system 100 as an analog, or continuous, signal. The rail voltage signal 134 is converted to a digital signal by an analog-to-digital converter (ADC) 106. The ADC 106 may be a sigma-delta, pipeline, folding/interpolating and/or flash type A/D converter. The ADC 106 may maintain about 10 bits or more of precision. The converted signal may be passed through a digital low pass filter ("LPF") 108, which filters out noise and smooths fluctuations in the digital rail voltage signal.

The rail voltage signal 134 is received by the threshold detectors 110 and 112. The threshold detectors 110 and 112 compare the rail voltage signal to, or measure the rail voltage against, a reference. The reference may be a stored value or predetermined signal that represents a tuning voltage or other standard to which the rail voltage may be compared as a reference. The reference may represent the value of the rail voltage B+ at a time that the audio system is tuned or installed. The threshold detectors 110 and 112 compare the audio signal on the output of the corresponding limiter 114 and 116 to a variable threshold. When the audio signal on the output of the limiter 114 and 116 exceeds the threshold, the threshold detectors 110 and 112 controls the corresponding limiter 114, 116 accordingly. In some systems where the limiters are configured as variable gain amplifiers, the threshold detectors 110 and 112 control the variable gain amplifiers 114, 116 to reduce or limit the amount of gain provided. When the audio signal on the output of variable gain amplifier 114 and 116 does not exceed the threshold, the gain is controlled to increase the gain provided. The gain may be increased to a maximum, such as unity gain. The gain may be increased at a release rate and/or decreased at an attack rate. For example, the gain may be increased at around 10 dB to around 100 dB per second, until the gain is set to unity gain, or until the corresponding threshold detector 110 and 112 determines that the audio signal exceeds the threshold and reduces the gain. The gain also may be reduced at an attack rate in the range of around 100 dB to around 1000 dB per second, until the audio signal does not exceed the threshold.

The threshold is varied, controlled, or adjusted according to the comparison of the rail voltage signal 134 to the reference or tuning voltage. For example, when the comparison of the rail voltage B+ to the reference or tuning voltage determines that the rail voltage is less than the reference or tuning voltage, the threshold is lowered. The threshold is lowered to a point or level appropriate for the detected rail voltage B+. When the comparison of the rail voltage B+ to the reference or tuning voltage determines that the battery voltage exceeds the reference or tuning voltage, the threshold may be increased. Increasing the threshold allows the threshold detector to control the variable gain amplifiers 114 and 116 according to a higher threshold when the rail voltage B+ is at a higher voltage, and at a lower threshold when the rail voltage B+ is at a lower voltage. The limiters 114 and 116 are controlled according to the amount of voltage that may be available to amplify the audio signal.

The DACs 118 and 120 receive the gain controlled audio signal from the corresponding variable gain amplifier 114 and 116. Each DAC 118 and 120 converts the digital audio signal at its input to a corresponding analog signal provided at it output. The DAC 118 and 120 may include switches, a network of resistors, current sources, capacitors, combinations thereof, and the like. The DAC's 118, 120 may be configured as a Pulse Width Modulator, an oversampling or Delta-Sigma DAC, a binary weighted DAC, a R2R Ladder DAC, a segmented DAC, or a hybrid DAC.

In another example of a distortion compensation system 100, the limiters 114, 116 may be configured as compressors. The compressor may adjust the level of the audio signal provided to the input. The compressor may reduce the level of louder passages in the audio signal to control distortion while still providing a higher overall signal level. At lower levels, the compressor passes the input signal to the output at a linear, or substantially linear level. The linear level may be, for example, about a 1:1 ratio. As the input signal increases, it approaches a threshold, or compression knee. At levels above the threshold or knee, the output signal is lower than the input signal, for example by a ratio of 2:1 or higher. In the example where one or more of the limiters 114 and 116 are configured as compressors. The threshold, or knee, of the compressor 114 and 116 is adjusted according to the rail voltage signal 134. The threshold is adjusted according to the comparison of the rail voltage signal 134 to the reference or tuning voltage. When the rail voltage B+ is less than the reference, the threshold is lowered to a point or level appropriate for the rail voltage B+. When the rail voltage B+ exceeds the reference, the threshold may be increased.

Figure 2:
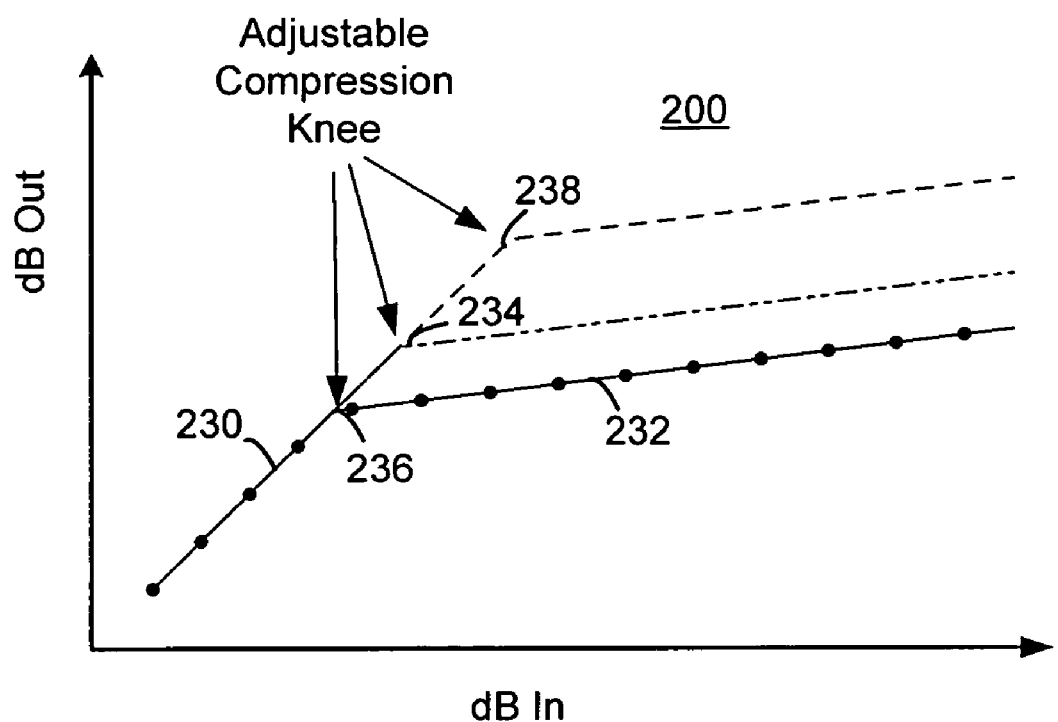
FIG. 2 is a graph of a transfer curve for a distortion compensation system.

FIG. 2 illustrates a plot of input/output curves 200 for an exemplary distortion compensation system having limiters 114 and 116 configured as compressors. The input/output plot 200 includes a linear area 230 and a compression area 232. The linear area 230 and compression area 232 are separated at a compression knee 234, 236 and 238. In the linear area 236, the output of the compressor substantially follows the input to the compressor in a linear relationship. For example, for a range of inputs to the limiters configured as compressors the output has a linear relationship to the input signal. The linear relationship may have about a 1:1 ratio. As the input level increases, it approaches the compressor knee 234, 236 and 238. As the input level increases beyond the compressor knee 234, 236 and 238 and into the compression area 232, the output is compressed. In the compression area 232, the output will be less than the input. For example, in the compression area 232, the input-to-output ratio may be 5:1 where for every 5 dB of input the output may increase 1 dB.

As the rail voltage B+ changes, the distortion compensation system adjusts the compressor knee 234, 236 and 238 up or down the linear range of the compressor. For example, the compressor may be set to have a compressor knee 234 at a tuning or nominal voltage level. As the rail voltage B+ decreases from a tuning voltage, the compressor knee 234 for the tuning voltage is moved down the linear curve to a lower level 236 according to the lower rail voltage. As the rail voltage B+ increases from a tuning voltage, the compressor knee 234 for the tuning voltage 234 is moved up the linear curve to a higher level 238 according to the higher rail voltage. The compressor knee may be moved along the linear portion of the curve 200 according to the rail voltage B+. For lower rail voltages, the compressor knee 236 is lowered so that compression begins for lower levels of the input signal. For higher rail voltages B+, the compressor knee is increased so that compression does not begin until a higher input level.

Figure 3:
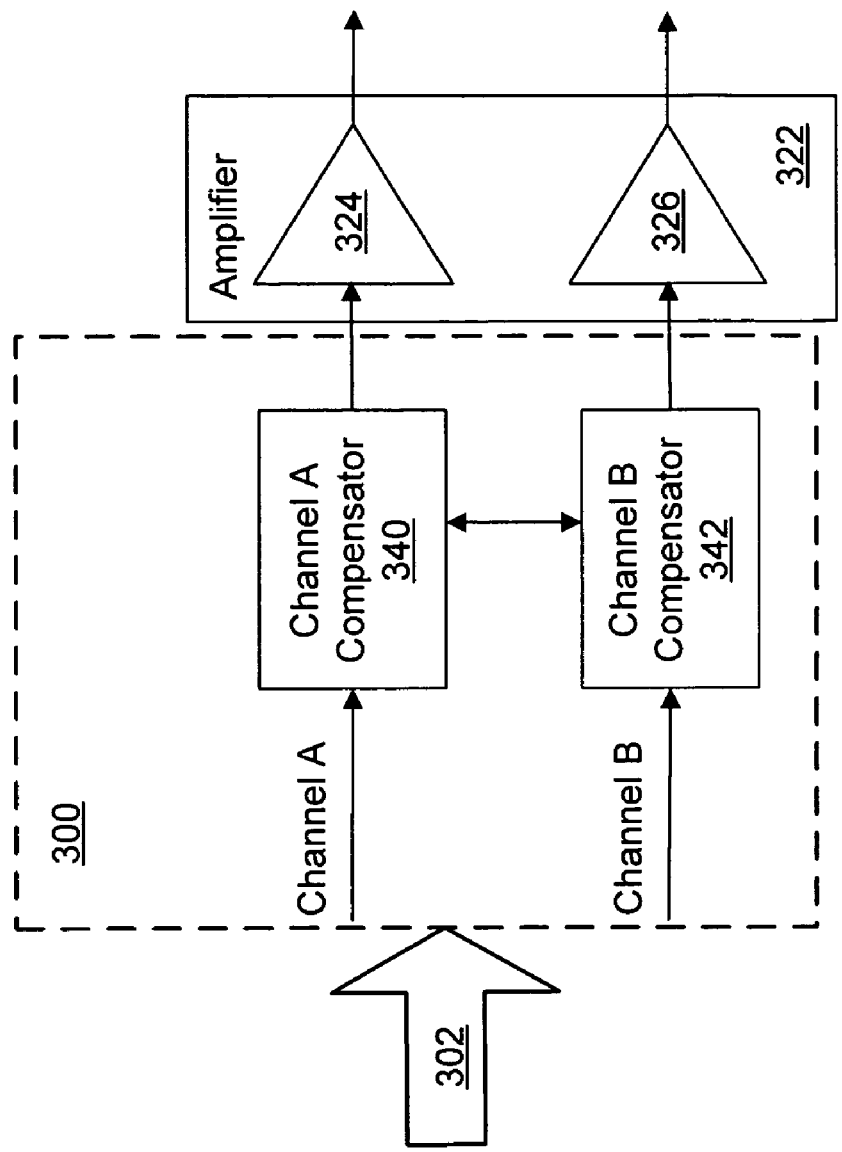
FIG. 3 is a distortion compensation system for linked channels.

FIG. 3 illustrates a distortion compensation system 300 having linked channels. A multi-channel signal 302 is provided to the distortion compensation system 302. The multi-channel signal 302 may be as described with reference to FIG. 1. The multi-channel signal 302 may be any signal having one or more channels. FIG. 3 illustrates a multi-channel signal 302 having two channels, Channel A and Channel B. Each channel is linked to a respective limiter 340 and 342. The limiters 340 and 342 may adjust a threshold of an audio processing circuit for a channel of the multi-channel signal 302 according to a threshold. For example, the limiters 340 and 342 may be as described for FIG. 1 to adjust a gain according to a rail voltage B+. Alternatively or in addition, the limiters may be configured as compressors where a compressor knee maybe adjusted according to a rail voltage B+. The processed signal of the limiters 340 and 342 may be received by respective input channels 324 and 326 of an amplifier 322.

The limiters 340 and 342 may be linked based on a pairing. In the distortion compensation system 300 of FIG. 3, channel A limiter 340 is linked to channel B limiter 342. For example, the channel A limiter 340 may be associated with a right channel and the channel B limiter 342 may be associated with a left channel of a stereophonic signal. The multi-channel signal 302 may be a surround sound audio signal having a front right channel paired with a front left channel to provide a stable sound stage, where channel A limiter 340 processes the front right channel and channel B limiter 342 processes the front left channel according to a threshold that is controlled according to a rail voltage. The channel A limiter 340 is linked to the channel B limiter 342. By linking the limiters, a balance between the channels may be maintained according to the dynamics of a signal of one of the channel. The limiters 340 and 342 may be linked according to coded software for a configuration of a signal processor for the distortion compensation system 300. For example, limiter 340 attenuates the channel A signal based on detecting a portion of channel A that exceeds a threshold. The limiters are linked according to the signal or driver pairing so that the channel B limiter 342 will also substantially simultaneous attenuate the channel B signal, even though the channel B signal may not exceed the threshold. The linked limiters 340 and 342 maintain a preset balance or bias to provide a stable sound stage. If one channel is attenuated, a paired channel is also attenuated so that the original dynamics of the signal 302 may be perceived by a listener.

Figure 4:
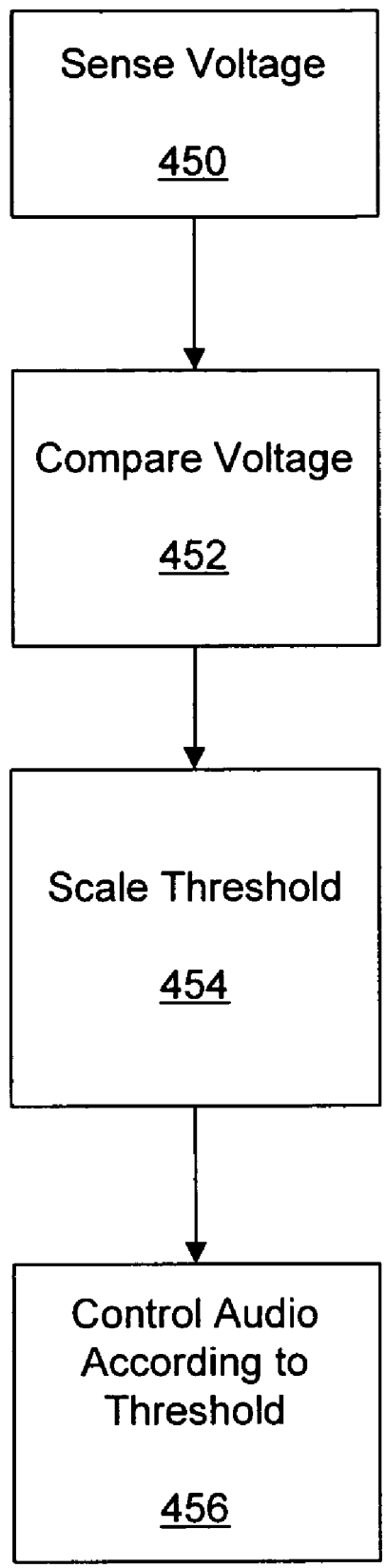
FIG. 4 is a flow chart for distortion compensation.

FIG. 4 illustrates a method for compensating for acoustic distortion. In the method, a gain of at least one channel of an audio signal is controlled according to whether the audio signal exceeds a variable threshold. The threshold may be varied or adjusted according to rail or supply voltage. The supply voltage may be provided by a battery or other constant voltage supply. In this method, the supply voltage is sensed 450. The sensed voltage is compared 452 to a control or baseline. For example, the control may be a tuning voltage and the sensed voltage is compared to a supply voltage during a tuning of the audio system. The threshold may be scaled 454 according to the comparison 452 of the sensed voltage to the control. The threshold may be adjusted or increased when the comparison shows that the sensed voltage is greater that the predetermined tuning voltage. Similarly, the threshold may be adjusted or decreased when the comparison shows that the sensed voltage is less than the predetermined tuning voltage.

The audio signal is controlled 456 according to the threshold. For example, the threshold may be a limit above which a gain or attenuation to a signal is provided to a channel of an audio signal. When it a channel of the audio signal exceeds the threshold, the gain for the signal is decreased below unity gain so that the signal is attenuated. In an example, the gain may be reduced by an attack rate in the range of about 100 dB per second to about 1000 dB per second. When the signal no longer exceeds the threshold, the gain is increased back to unity gain.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. An automotive audio amplifier comprising:
   an acoustic signal processor configured to control gain for at least one channel of a multi-channel audio signal, the gain being controlled according to a gain adjust signal;
   a voltage sensor configured to generate a voltage sense signal associated with a battery supply voltage for the amplifier; and
   a threshold detector configured to generate the gain adjust signal according to detecting whether an output of the gain circuit exceeds a clipping threshold, the clipping threshold being adjustable according to the voltage sense signal;
   where the clipping threshold is adjusted to clip channels of the multi-channel audio signal in accordance with a threshold corresponding to the battery supply voltage at a time of tuning the automotive audio amplifier.

2. The amplifier of claim 1 where the acoustic signal processor is configured to control gain for a plurality of linked channels for the multi-channel audio signal, the gain for each linked channel being controlled according to the gain adjust signal.

3. The amplifier of claim 1 where the voltage sensor further comprises a low pass filter to provide a filtered signal associated with a rail voltage for the amplifier.

4. The amplifier of claim 1 further comprising a digital signal processor configured to monitor a level of each channel of the multi-channel audio signal.

5. The amplifier of claim 1 where the clipping threshold is increased when the threshold detector detects that the voltage sensed by the voltage sense signal is greater than the reference voltage.

6. An automotive audio system comprising:
   a controller configured to control gain adjustment for each channel of a multi-channel audio signal according to whether the multi-channel audio signal exceeds a clipping threshold;
   the controller further configured to adjust the clipping threshold according to a supply voltage for the audio system relative to a tuning voltage, the clipping threshold being adjusted to clip channels of the multi-channel audio signal in accordance with a threshold corresponding to the tuning voltage at a time of tuning the automotive audio system; and
   an amplifier configured to process a gain-adjusted multi-channel audio signal, where the controller lowers the clipping threshold when the supply voltage is less than the tuning voltage.

7. An automotive audio system comprising:
   a controller configured to control gain adjustment for each channel of a multi-channel audio signal according to whether the multi-channel audio signal exceeds a clipping threshold;
   the controller further configured to adjust the clipping threshold according to a supply voltage for the audio system relative to a tuning voltage, the clipping threshold being adjusted to clip channels of the multi-channel audio signal in accordance with a threshold corresponding to the tuning voltage at a time of tuning the automotive audio system; and
   an amplifier configured to process a gain-adjusted multi-channel audio signal, where the controller increases the clipping threshold when the supply voltage is above the tuning voltage.

8. A method for compensating for acoustic distortion in an automotive audio system comprising:
   controlling a gain of at least one channel of a multi-channel audio signal with a controller according to whether the audio signal exceeds a clipping threshold;
   sensing a rail voltage with the controller;
   comparing the sensed rail voltage to a predetermined tuning voltage with the controller, the predetermined tuning voltage being the rail voltage at a time of tuning the automotive audio system; and
   adjusting the clipping threshold with the controller according to the comparison of the sensed rail voltage to the predetermined tuning voltage to maintain a substantially fixed level of distortion by clipping channels of the multi-channel audio signal at the adjusted clipping threshold corresponding to the predetermined tuning voltage.

9. The method of claim 8 where the rail voltage comprises a battery voltage.

10. The method of claim 8 further comprising the controller reducing the clipping threshold when the rail voltage is below the tuning voltage.

11. The method of claim 8 further comprising the controller increasing the clipping threshold when the rail voltage is above the tuning voltage.

12. The method of claim 8 where controlling the gain comprises the controller reducing the gain of the at least one channel of the audio signal during portions of the audio signal that exceed the clipping threshold.

13. The method of claim 8 where controlling the gain comprises increasing the gain of the at least one channel of the audio signal to unity gain when portions of the audio signal for the at least one channel does not exceed the clipping threshold.

14. The method of claim 8 where adjusting comprises:
   detecting with the controller whether the audio signal of each channel of a multi-channel amplified audio signal exceeds the adjusted clipping threshold; and
   reducing the gain of a channel of the multi-channel audio signal with the controller when it is detected that the audio signal of the channel exceeds the adjusted clipping threshold, the gain being reduced by an attack rate in the range of about 100 dB per second to about 1000 dB per second.

15. The method of claim 8 further comprising increasing the gain of the at least one channel of the multi-channel audio signal toward a maximum gain with the controller when the audio signal of the at least one channel does not exceed the adjusted clipping threshold.

16. The method of claim 15 where the maximum gain comprises unity gain.

17. The method of claim 8 further comprising:
   controlling the gain of a first channel of the audio signal with the controller according to whether a second channel of the audio signal exceeds the clipping threshold.

18. The method of claim 17 where the first and second channel comprise paired channels of a multi-channel audio system.

19. An automotive audio amplifier comprising:
   an acoustic signal processor configured to control gain for at least one channel of a multi-channel audio signal, the gain being controlled according to a gain adjust signal;
   a voltage sensor configured to generate a voltage sense signal associated with a battery supply voltage for the amplifier; and
   a threshold detector configured to generate the gain adjust signal according to detection that an output of a gain circuit for the at least one channel exceeds a clipping threshold,
   the clipping threshold being adjustable according to the voltage sense signal so that the clipping threshold maintains a substantially fixed level of distortion by clipping channels of the multi-channel audio signal at a threshold relative to the battery supply voltage, where the clipping threshold is reduced when the threshold detector detects that a voltage sensed by the voltage sense signal is less than a reference voltage corresponding to a tuning voltage at a time of tuning the automotive audio amplifier, and the gain is reduced when the threshold detector detects that the at least one channel of the multi-channel audio signal exceeds the reduced clipping threshold.

20. The amplifier of claim 19 where the gain is reduced at an attack rate in the range of about 100 dB per second to about 1000 dB per second.

21. The amplifier of claim 20 where the clipping threshold is increased when the threshold detector detects that a voltage sensed by the voltage sense signal is greater than a reference voltage, and the gain is increased towards unity gain when the threshold detector detects that the at least one channel of the multi-channel audio signal does not exceed the increased clipping threshold.

22. The amplifier of claim 21 where the gain is increased at a release rate in the range of about 10 dB per second to about 100 dB per second.

* * * * *

UNITED STATES PATENT AND TRADEMARK OFFICE
CERTIFICATE OF CORRECTION

PATENT NO. : 8,036,402 B2
APPLICATION NO. : 11/305498
DATED : October 11, 2011
INVENTOR(S) : Kenneth Carl Furge It is certified that error appears in the above-identified patent and that said Letters Patent is hereby corrected as shown below:

Title Page, Item (56)
Under the Foreign Patent Documents

Page 2, Column 2, please add "WO 02/15386 A2  02/2002".

Signed and Sealed this
Fourteenth Day of February, 2012

David J. Kappos
*Director of the United States Patent and Trademark Office*